United States Patent [19]

Johnson et al.

[11] Patent Number: 5,761,137

[45] Date of Patent: Jun. 2, 1998

[54] DRAM ACCESS SYSTEM AND METHOD

[75] Inventors: William Michael Johnson; Thang Tran; Stephen Charles Kromer, all of Austin, Tex.

[73] Assignee: Advanced Micro Devices, Inc., Sunnyvale, Calif.

[21] Appl. No.: 782,561

[22] Filed: Jan. 9, 1997

Related U.S. Application Data

[63] Continuation of Ser. No. 354,272, Dec. 12, 1994, abandoned, and Ser. No. 7,073, Jan. 21, 1993, abandoned.

[51] Int. Cl.$^6$ ............................................. G11C 7/00
[52] U.S. Cl. .............. 365/193; 365/189.05; 365/230.08; 365/233; 365/238.5
[58] Field of Search ........................ 365/189.05, 193, 365/230.08, 233, 238.5

[56] References Cited

U.S. PATENT DOCUMENTS

| | | | |
|---|---|---|---|
| 4,044,330 | 8/1977 | Johnson et al. | 365/193 X |
| 4,792,929 | 12/1988 | Olson et al. | 365/193 X |
| 4,797,850 | 1/1989 | Amitai | 365/193 X |
| 4,924,441 | 5/1990 | Inskeep | 365/193 X |
| 5,173,878 | 12/1992 | Sakui et al. | 365/193 X |

FOREIGN PATENT DOCUMENTS

| | | |
|---|---|---|
| A-0343769 | 11/1989 | European Pat. Off. . |
| A-0517240 | 12/1992 | European Pat. Off. . |

OTHER PUBLICATIONS

IBM Technical Disclosure Bulletin; vol. 33, No. 10A, pp. 149–151, "Three-Cycle Pipeline for High Performance SRAM Macros" (Mar. 1991).

Technical Digest (AT&T Technologies); No. 77, p. 47; "Memory Addressing Arrangement" (Oct. 1985).

Primary Examiner—Do Hyun Yoo
Attorney, Agent, or Firm—Jenkins & Gilchrist; Michael J. Balconi-Lamica; Paul S. Drake

[57] ABSTRACT

A data latching mechanism uses Column Address Strobe (CAS) signals to effect one-cycle DRAM page-mode access at high operation frequency.

7 Claims, 8 Drawing Sheets

DATA LATCHING MEANS

DRAM ACCESS SYSTEM AND METHOD

This application is a continuation of application Ser. No. 08/354,272, filed on Dec. 12, 1994 abandoned upon the filing hereof, and application Ser. No. 08/007,073, filed on Jan. 21, 1993 now abandoned.

CROSS REFERENCES TO RELATED APPLICATIONS

This application is related to the following U.S. patent applications:

| SER. NO. | TITLE | INVENTOR |
| --- | --- | --- |
| 08/006,745 | Combination Prefetch Buffer and Instruction Cache | Tran |
| 08/006,744 | Data Cache Reloading System and Method | Johnson et al. |
| 08/006,731 | Circuit for Delaying Data Latching from a Precharged Bus and Method | Tran |

The above listed applications are all filed on even date herewith, are all assigned to the assignee of this invention, and are all hereby incorporated herein by reference as if reproduced in their entirety herein.

BACKGROUND OF THE INVENTION

1. Field of the Invention

The present invention relates generally to memories employed in computer systems. More particularly, the present invention relates to methods for accessing data stored in page-mode memories employed in such systems.

2. Description of Related Art

It has been and continues to be desired to increase the operating speed of computer systems. One approach to accomplish this has been to increase the clock frequency of the central processing unit ("CPU") of the computer. This allows a greater number of instructions to be processed per unit time. However, this approach is limited if the access time, that is, the amount of time required to read data from memory, is not correspondingly shortened.

One technique those skilled in the art have heretofore developed to reduce access time is use of page-mode memory. In this technique, memory is divided into a number of pages, each of which consists of a row having a particular address. Each row, in turn, consists of a number of columns having corresponding column addresses. With memory so structured, a row address can be supplied to the memory to enable selection of a particular page in the memory where certain data is located. Then, the column address associated with the certain, desired data can be supplied to the memory to enable selection of that data within the addressed row or page. This process effectively allows access to a particular piece of data stored in a page-mode memory.

To facilitate the understanding of the concepts referred to herein, which concepts are most clearly expressed with reference to specific examples, an example of a prior art page-mode system will now be discussed in detail.

Figure 1:
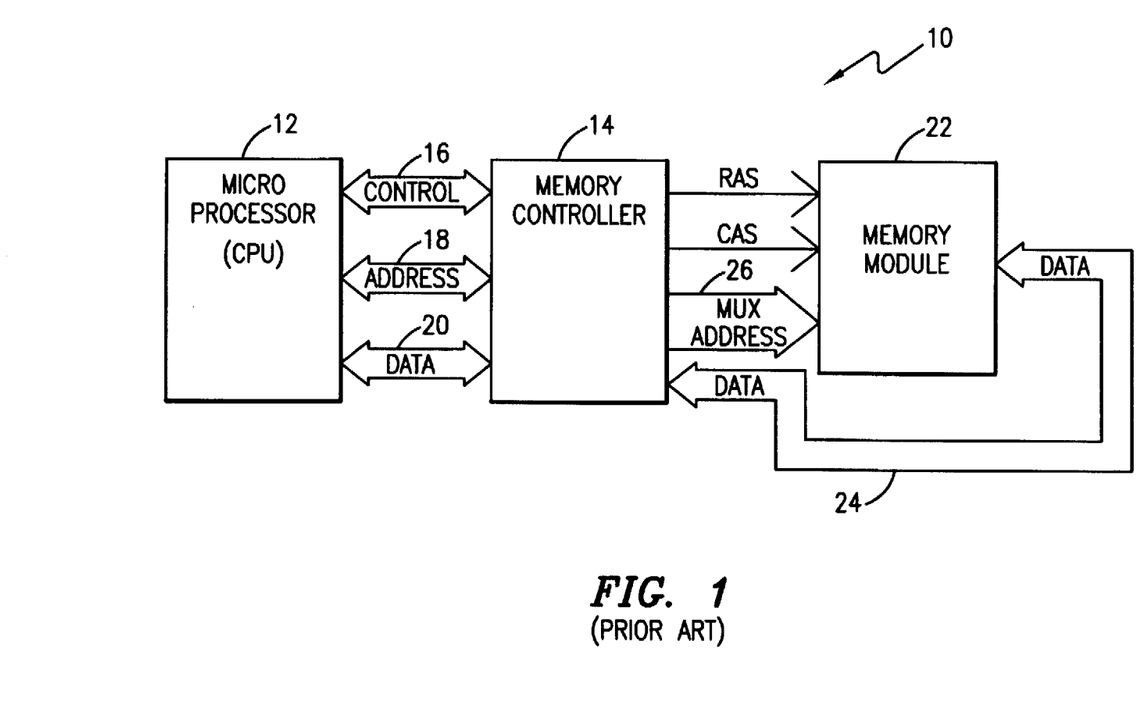
FIG. 1 (already discussed) is a simplified block diagram of a conventional computer system with a page-mode memory.

A block diagram of a page-mode memory system is depicted in FIG. 1. This system (generally designated by reference numeral 10) includes a CPU 12 and a memory controller 14 interconnected by a control bus 16, an address bus 18, and a data bus 20. The memory controller 14 is further coupled to at least one memory module 22 consisting of random access memory ("RAM"). A data bus 24 is coupled between the memory controller 14 and the memory module 22 to permit the transfer of data therebetween.

Continuing to refer to FIG. 1, it may be seen that a multiplexed ("mux") address bus 26 is coupled between the memory controller 14 and the memory module 22. This bus 26 allows row and column address information to be passed from the memory controller 14 to the memory module 22. This bus 26 is multiplexed to allow delivery of a row or page address during a memory access cycle and subsequently to allow delivery of a column address.

The memory controller 14 also provides row address strobe ("RAS") and column address strobe ("CAS") signals to the memory module 22. The nature and function of these signals is discussed in detail hereinbelow.

Figure 2:
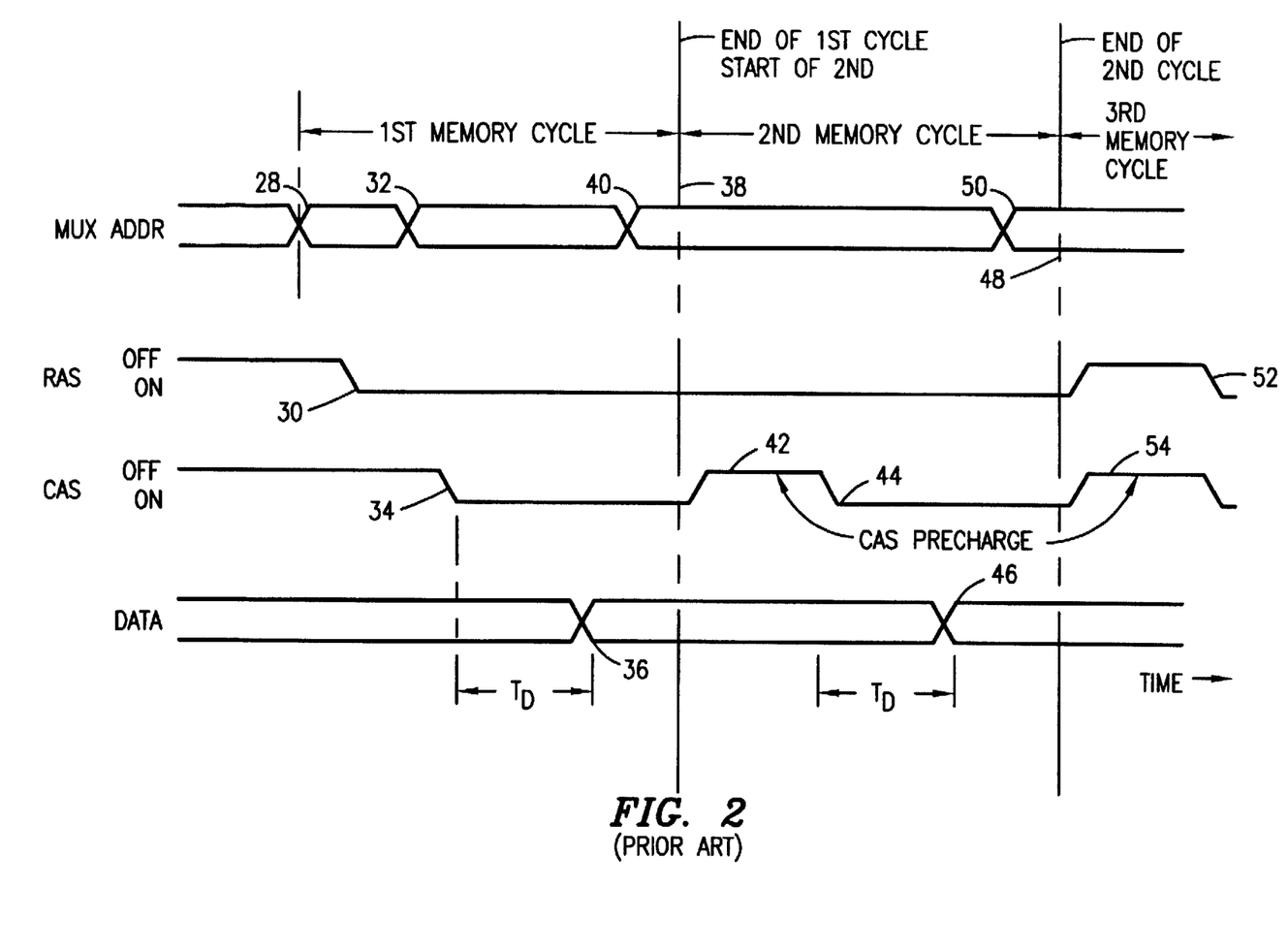
FIG. 2 (also already discussed) is a timing diagram associated with a typical, conventional page-mode memory.

Referring now to FIG. 2, there is shown several typical memory cycles associated with the computer memory system 10. By way of example, it may be assumed that the CPU 12 desires to access a first piece of data from the memory module 22. This piece of data has an associated address. To access this piece of data, the CPU 12 first sends its address to the memory controller 14. The memory controller 14 divides the address into a row or page address portion, and a column address portion. The two portions—that is, the row address portion and the column address portion—are then multiplexed onto the mux address bus 26. In FIG. 2, point 28 designates the point at which the memory controller 14 first provides the row address to the mux address bus 26. At this time, the RAS signal will be "high" or "off". That is, as negative logic is employed in this example, "high" corresponds to an "off" state, and "low" corresponds to an "on" state. The RAS signal goes on at point 30 to select the row address portion presently supplied to the mux address bus 26. By this means, the memory module 22 selects the particular page or row in which the address data is stored.

After RAS goes on and the row address is selected, at point 32 the column address portion of the desired data is supplied to the mux address bus 26. The CAS signal is then driven "on" at point 34 to select the column address portion presently supplied to the mux address bus 26. At this point, as the memory module 22 has received both the row and column address portions for a particular piece of data, the module 22 can access the data thus addressed and provide the accessed data to the memory data bus 24 (see FIG. 1). The data on the memory data bus 24 becomes valid at point 36 after a predetermined period of time (designated $T_D$) passes after completion and selection of the address at point 34. The microprocessor can then receive the addressed data via data bus 20 (shown in FIG. 1).

Continuing the example presented, it may now be assumed that a second piece of data located in the same page or row as the first piece of data is to be accessed from the memory module 22. Those skilled in the art use the term "pipelining" to describe the act of changing the address (for example, by changing the column address portion thereof) prior to the end of the current memory cycle in preparation for the next memory cycle. Pipelining itself saves time since it permits address decoding circuitry in the memory controller 14 to start processing the address earlier than would otherwise be possible. An example of such pipelining is seen in FIG. 2 where subsequent to the date of becoming valid at point 36, and prior to the end of the first memory cycle at point 38, the column address is changed to a new column address at point 40, such column address corresponding to the second piece of data. Since the second piece of data to be accessed in the second memory cycle is in the same page as the data accessed in the first memory cycle, the column address portion changes at point 40 while the row address portion remains the same. This situation is referred to as a "page hit". Since it is not necessary to resend the row address portion to the memory module 22 when a "page hit" occurs, valuable time can be saved in a page-mode memory arrangement.

Before the memory module 22 can select and actually use the column address information now present on the mux address bus 26, it is necessary to drive the CAS signal "off" for a predetermined period of time referred to as the CAS precharge 42. Once the CAS precharge is completed, CAS is driven "on" again at point 44, such that the column address portion of the second piece of data is selected by the memory module 22. The address of the second piece of data is thus completed and the data "on" memory address bus 24 becomes valid at point 46 after a predetermined time delay (also designated $T_D$ in FIG. 2) from completion and selection of the address at point 44. The microprocessor 12 can then pick up the addressed data from the data bus 20 (shown in FIG. 1). The second memory cycle then ends at point 48.

Still further continuing the example presented, it may now be assumed that a third piece of data located in a different page or row than the first and second pieces of data is accessed in a third memory cycle commencing at point 48 in FIG. 2. Only a portion of such a third memory cycle is shown in FIG. 2. This situation is referred to as a "page miss". That is, a new row address portion corresponding to the location of a third piece of data must be provided to the memory module 22. Such new row address portion appears on the mux address bus 26 via pipelining at point 50. At the beginning of the third memory cycle, RAS is driven off in preparation for the next row address. The new row address is actually selected when RAS is driven "on" at point 52. The remainder of the third memory cycle is substantially similar to the first memory cycle in FIG. 2 with CAS precharge being provided at point 54 near the beginning of the third memory cycle.

The detailed description set forth above of the timing diagram shown in FIG. 2 should render the timing diagrams shown in FIGS. 4–7 clearly understandable to those skilled in the art. The timing diagrams shown in FIGS. 4–7 illustrate signal status in a high performance DRAM access system (i.e., systems operating at high frequency as now conventionally understood). Because these timing diagrams clearly and succinctly illustrate the advances made by the present invention, they will be discussed in considerable detail in the detailed description of the invention section below.

As those skilled in the art are well aware, DRAM controllers must provide read, write, and page-mode access to DRAMs and they must also meet all of the specifications of associated DRAMs for setup and hold times. DRAM controller and DRAM system specifications are based on the rising and falling edges of the system clock.

In a load request to a DRAM, load data is normally latched by internal clocks which duplicate, or mirror, the system clock. As those skilled in the art should be able to appreciate based upon the signal statuses depicted in FIGS. 4–7, for a high performance DRAM page-mode access the timing of valid data does not match well with the system clock. Therefore, if the system clock is employed to latch data, a DRAM page-mode access requires at least two cycles. This fact runs counter to design desires to reduce access time in and to increase operating speed of computer systems. Such a two cycle DRAM page-mode access is a shortcoming and deficiency of the prior art.

SUMMARY OF THE INVENTION

The present invention overcomes the shortcoming and deficiency of the prior art described above by providing a high-performance DRAM access system and method in which CAS signals are used to latch data.

Accordingly, it is an object of the present invention to provide a high performance DRAM page-mode access system and method that can latch data in one cycle.

BRIEF DESCRIPTION OF THE DRAWINGS

For a more complete understanding of the present invention, and for further objects, advantages, and novel features thereof, reference may now be had to the following detailed description of the invention taken in conjunction with the accompanying drawings wherein.

DETAILED DESCRIPTION OF THE DRAWINGS

Although, as previously mentioned, the present invention is clearly and succinctly described by the timing diagrams depicted in FIGS. 4–7, to facilitate actual implementation of the principles of the present invention some understanding of DRAMs is helpful. Thus, to provide such help, a conventional DRAM will be discussed prior to describing the timing diagrams of FIGS. 4–7.

Figure 3:
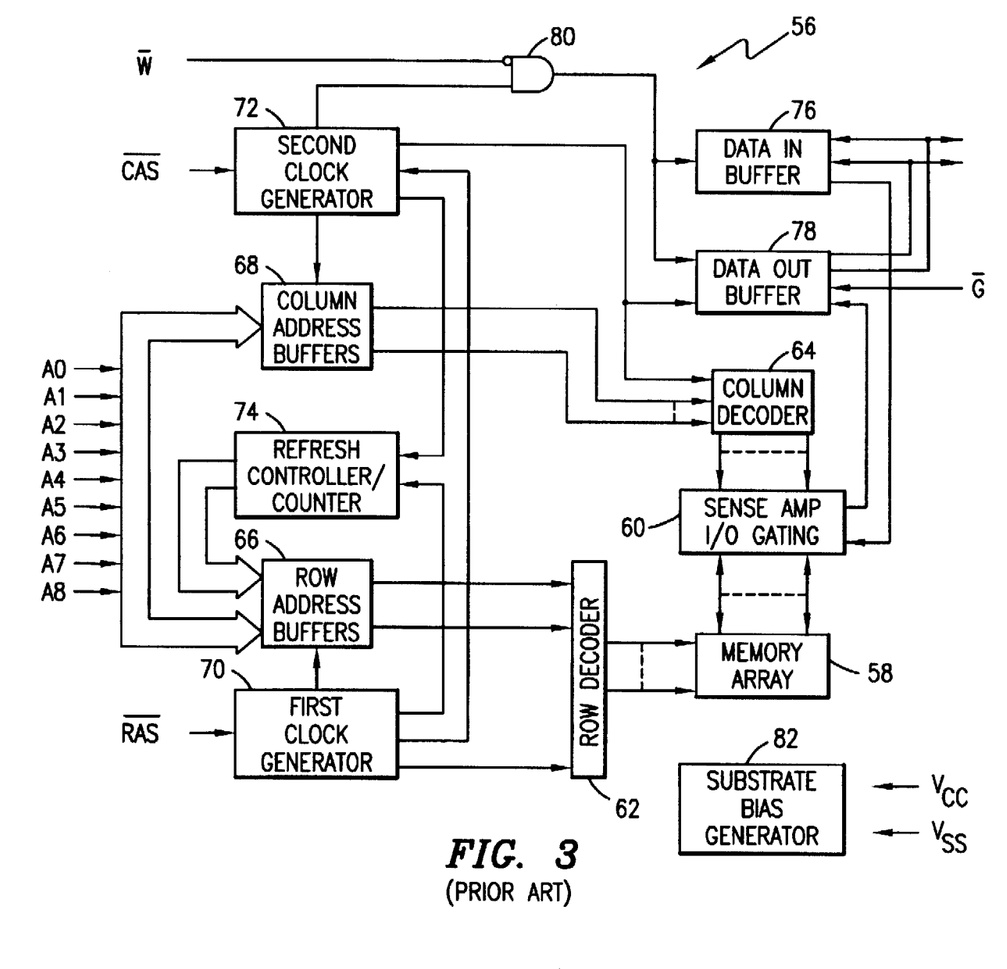
FIG. 3 is a block diagram of a conventional DRAM.

Referring now to FIG. 3, a prior art DRAM, generally designated by reference numeral 56, is illustrated. DRAM 56 consists of a memory array 58 which comprises a matrix of memory cells. Between a bit line pair of memory array 58 and an input/output line pair is coupled a bit line sense amplifier and input/output gating circuit 60 or a series of sense amplifiers to amplify the memory cell output.

Row and column decoders 62 and 64, respectively, are coupled to memory array 58 to decode the row and column address of the cell being accessed. Row and column address buffers 66 and 68, respectively, are coupled to the address input lines (A0–A8) and to row and column decoders 62 and 64. These buffers serve to store the address signals.

First and second clock generators 70 and 72 are coupled to the Row Access Strobe (RAS) and Column Access Strobe (CAS) inputs. These inputs control the operation of the row and column buffers and decoders, that is, elements 62, 64, 66, and 68.

Since dynamic memories are volatile and can loose data if not accessed or refreshed on a regular basis, a refresh controller/counter 74 is provided to refresh the memory array 58. Data In and Data Out buffers 76 and 78 are provided to store data that is being written to or read from memory array 58. Buffers 76 and 78 are controlled by a write enable signal (W), through an AND gate 80 and an output enable signal (G). A substrate bias generator 82 is provided coupled to a power line ($V_{CC}$) and ground (VSS).

A system clock drives a processor which provides control signals to a DRAM controller which in turn generates the RAS and CAS signals.

Reference may now be taken to the timing diagrams depicted in FIGS. 4–7. There are shown in FIGS. 4, 5, 6, and 7, respectively, a timing diagram for a DRAM read cycle, a timing diagram for a DRAM write cycle, a timing diagram for a DRAM page-mode read cycle, and a timing diagram for a DRAM page-mode write cycle, all in a high performance system.

To facilitate discussing the timing diagrams shown in FIGS. 4–7, and also to facilitate the understanding of those diagrams, signals common to the diagrams will now be discussed. There are eight "common" signals depicted in FIGS. 4–7: clock signals 84, address signals 86, read/write signals 88, RAS signals 90, CAS signals 92, write enable signals 94, output enable signals 96, and data signals 98. Clock signals 84 are timing signals generated by clocks within the memory controller. The "memory clocks" duplicate the system clock and the timing signals generated by them have heretofore been used to latch load data. The address signals 86 comprise the multiplexed row and column address portions discussed in the description of related art section above. The read/write signals 88 indicate which of the two operations are being performed. The RAS and CAS signals 90, 92 are inputs used to strobe in the row and column addresses, respectively, in the multiplexed address random access memory. The write enable signals 94 are inputs that can (e.g., when true) enable writing data into the memory. The output enable signals 96 can (e.g., when false) cause the output to be in the "off" or high impedance state. Finally, the data signals 98 comprise the accessed data on the memory data bus discussed in the description of related art section above.

Figure 4:
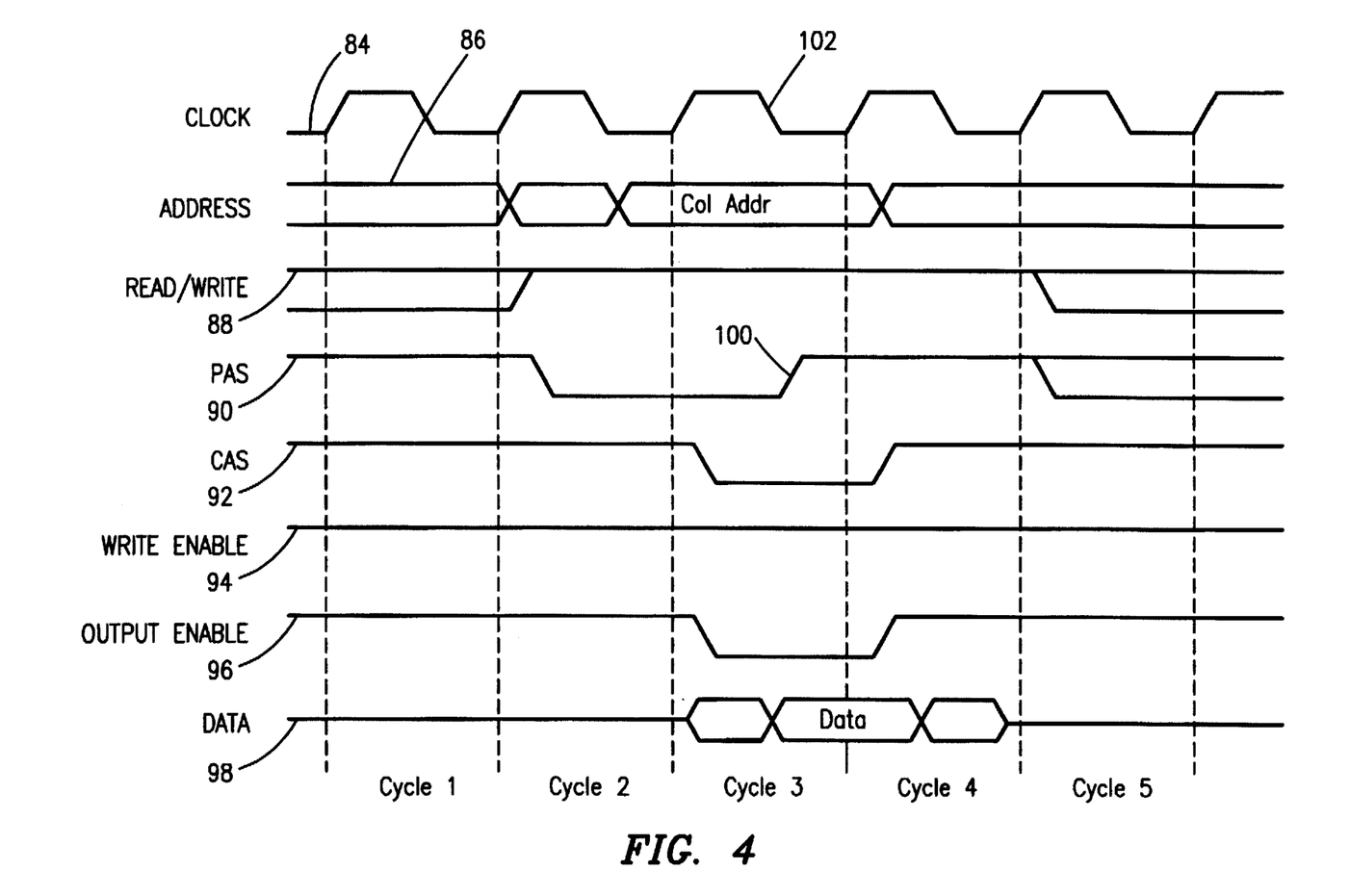
FIG. 4 depicts the timing for a DRAM read cycle in a high performance system.

Referring now specifically to FIG. 4, as previously mentioned, there is shown the timing for a normal DRAM read cycle. Five complete cycles, labeled CYCLE 1–CYCLE 5, are depicted in FIG. 4.

DRAM accesses require two cycles. Also, an additional cycle is taken after the data is read to permit time for RAS precharge. As may be seen in FIG. 4, the rising edge of the RAS signal 90 (designated by reference numeral 100) occurs on the second falling edge of the clock signal 84 (designated by reference numeral 102) after the beginning of the pertinent cycle.

Figure 5:
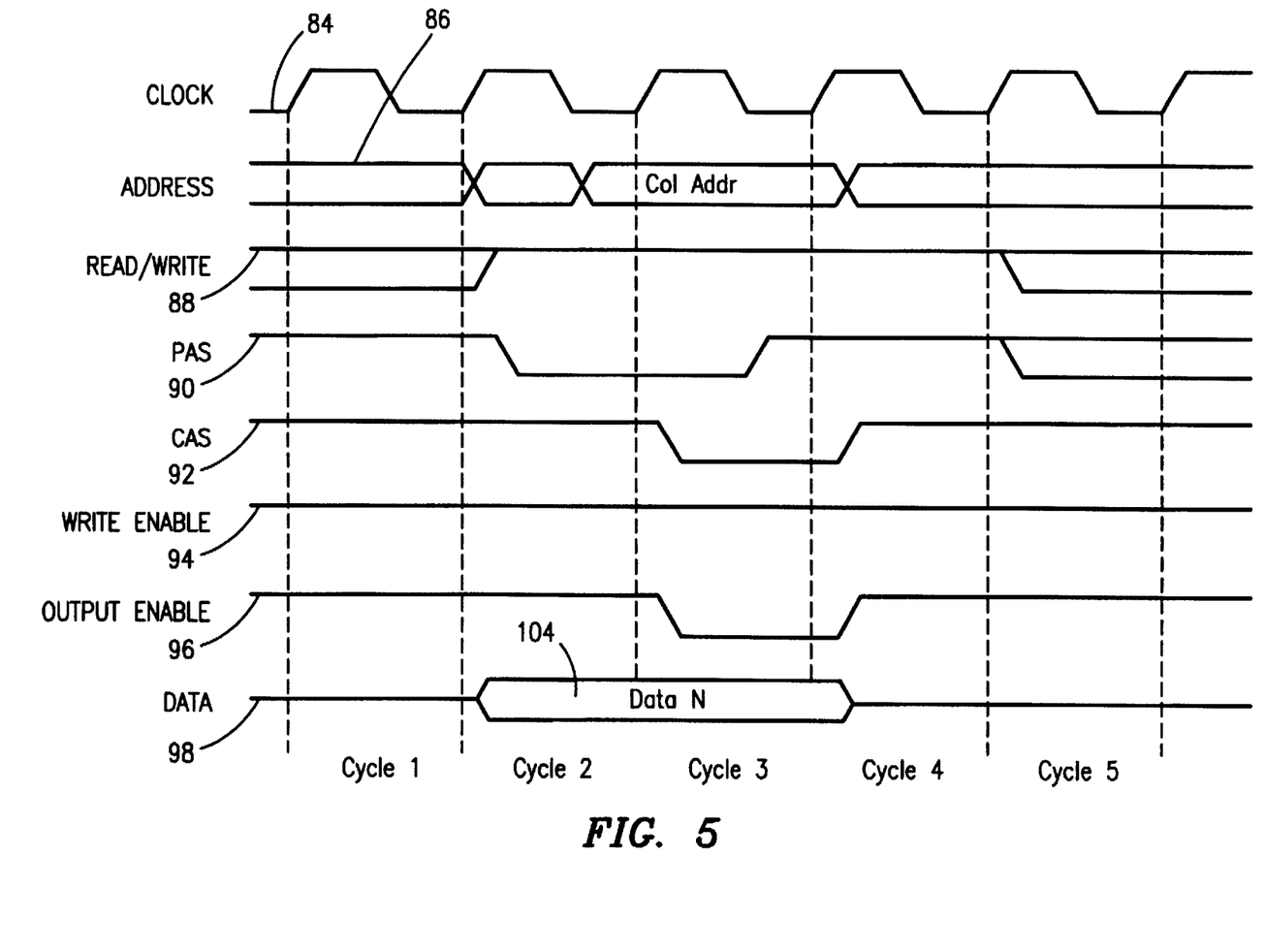
FIG. 5 depicts the timing for a DRAM write cycle in a high performance system.

Referring now to FIG. 5, regarding normal access timing on a write, it may be seen that data 104 is driven in the same cycle (designated CYCLE 2 in FIG. 4) as the one in which RAS 90 falls.

RAS address setup time ($t_{ASR}$) may be met by delaying the assertion of RAS. The CAS address can be driven halfway into the first cycle to meet the CAS address setup time ($t_{ASC}$). Also, the processor can be guaranteed to meet a RAS low time ($t_{RAS}$) that is 1.5 times the clock cycle time and a RAS precharge time ($t_{RP}$) that is 1.2 times the clock cycle time. For DRAM reads, each byte of data is latched into the processor with the rising edge of the clock.

In preferred embodiments of the present invention, DRAM timing may be designed so that 80 ns DRAMs can be used as 16 MHz clock frequency, 70 ns DRAMs at 20 MHz, and 60 ns DRAMs at 25 MHz.

Discussing now page-mode access timing, in embodiments of the present invention page-mode accesses can be enabled for each bank of a memory to reduce the average access time for a sequence of accesses. If enabled, page-mode accesses can be performed for instruction accesses, data-cache reload, and for other instructions. In embodiments of the present invention, page-mode accesses permit an access time of one cycle for all but the first access. When a DRAM bank is 16 bits wide, two accesses would be required to obtain a 32-bit word. Page-mode accesses may be performed to access the second 16 bits in such a case, provided that such accesses are enabled.

Figure 6:
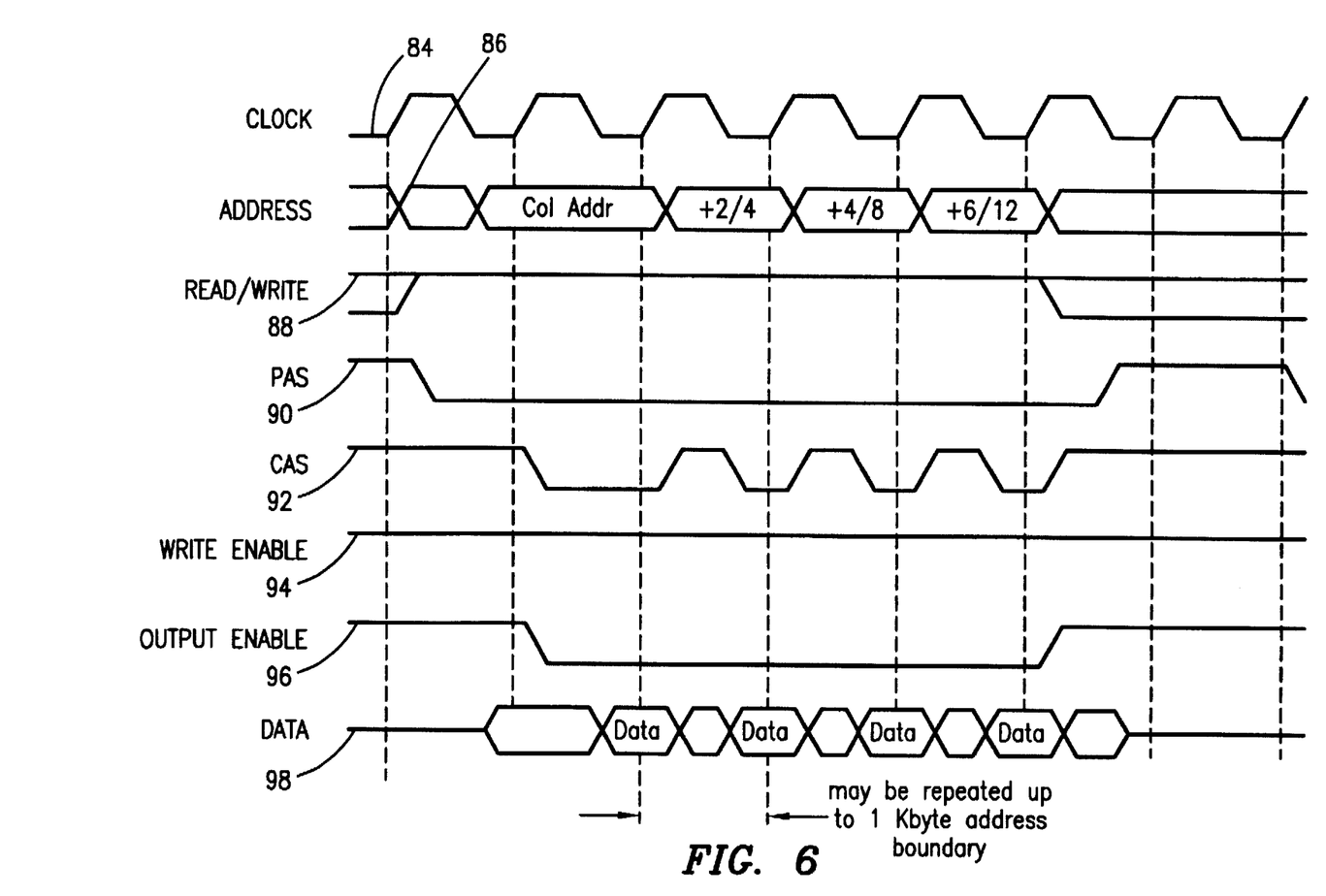
FIG. 6 depicts the timing for a page-mode DRAM read cycle in a high performance system.
Figure 7:
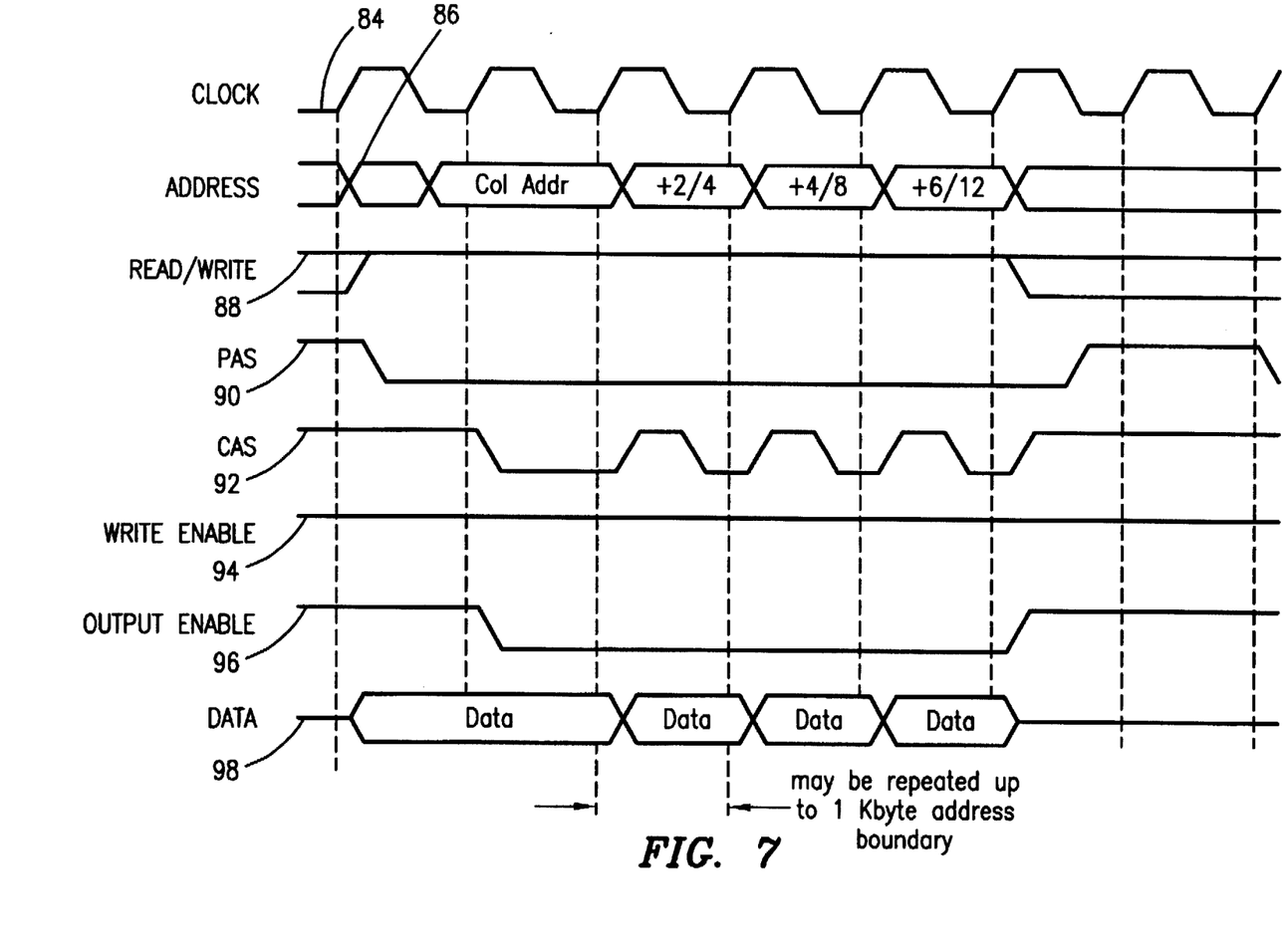
FIG. 7 depicts the timing for a page-mode DRAM write cycle in a high performance system.
Figure 8:
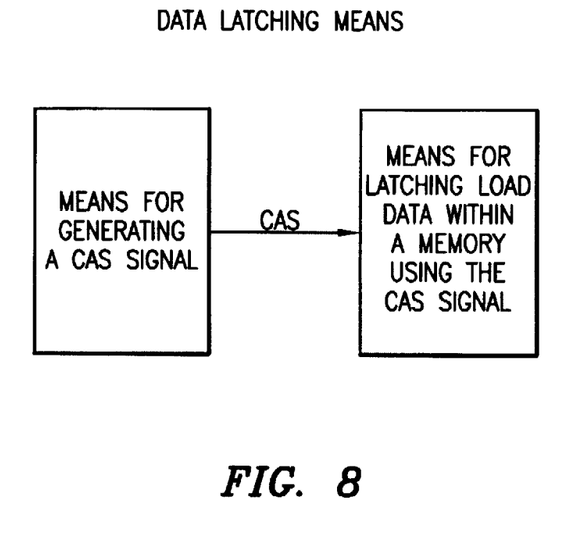
FIG. 8 is a block diagram showing the data latching means.

FIG. 6 shows the timing for a page-mode DRAM read cycle and FIG. 7 shows the timing for a page-mode DRAM write cycle. The CAS low time ($t_{CAS}$) and available CAS access time ($t_{CAC}$) are both guaranteed to be 0.4 times the clock cycle time. The available CAS access time is guaranteed by latching each data byte with the rising edge of the respective CAS. This removes the skew between the falling edge of CAS and the rising edge of the clock as a factor in the available access time. Therefore, the CAS signal is used to latch data.

FIG. 6 also shows how page-mode accesses might be used to reload a data cache block.

Based upon the foregoing, those skilled in the art should appreciate that the present invention provides a method of high-performance DRAM access. As is known to those skilled in the art, a DRAM controller must provide the read, write, and page-mode accesses to the DRAM and it must also meet all of the specifications of the DRAM for setup and hold times. In designing a DRAM controller, the operation frequencies of both the DRAM must be considered. The system specification is generally based upon the rising and falling edges of the system clock.

For a load request to a DRAM, the load data is normally latched by the internal clocks which mirror or duplicate the system clock. For a high-performance DRAM page-mode access, the timing of valid data does not match well with the system clock which would cause a two cycles DRAM page-mode access. According to the teachings of the present invention, this problem is solved by using CAS signals to latch the data. Use of such signals provides a one cycle page-mode access, whereas conventional controllers require two cycles.

Obviously, numerous modifications and variations are possible in view of the teachings above. Accordingly, within the scope of the appended claims, the present invention may be practiced otherwise than as specifically described herein.

What is claimed is:

1. In a system including a memory and a memory controller, a method for accessing data in said memory by latching said data, said method comprising the steps of:

generating a column address strobe signal within said memory controller; and timing the latching of data within said memory during page-mode access with said column address strobe signal, wherein data is latched in response to a rising edge of the column address strobe signal to permit a page-mode access time of one clock cycle for all but a first page-mode access.

2. A method as recited in claim 1, wherein said memory is a dynamic random access memory and wherein said memory controller is a dynamic random access memory controller.

3. A memory and a memory control system in which stored data has associated column addressess and is accessed by latching, said system comprising:

means for generating a column address strobe signal; and means for timing the latching of data during page-mode access with said column address strobe signal, wherein data is latched in response to a rising edge of the column address strobe signal to permit a page-mode access time of one clock cycle for all but a first page-mode access.

4. A memory and a memory control system as recited in claim 3, wherein said memory is a dynamic random access memory and wherein said memory control system comprises a dynamic random access memory controller.

5. A memory system comprising:

structure for generating a column address strobe signal;

structure for latching data in said memory system; and structure for timing the latching of data during page mode access with said column address strobe signal, wherein data is latched in response to a rising edge of the column address strobe signal to permit a page-mode access time of one clock cycle for all but a first page-mode access, further whereby said column address strobe signal is used to read data from memory to a control means.

6. A system memory as recited in claim 5, wherein said control means comprises a processor.

7. A system memory as recited in claim 5, wherein said control means comprises a memory controller.

* * * * *

UNITED STATES PATENT AND TRADEMARK OFFICE
CERTIFICATE OF CORRECTION

PATENT NO. : 5,761,137  
DATED : June 2, 1998  
INVENTOR(S) : Johnson, et al.

Page 1 of 1

It is certified that error appears in the above-identified patent and that said Letters Patent is hereby corrected as shown below:

Attorney, Agent, or Firm,
Replace "Jenkins" with -- Jenkens --

Column 6,
Line 65, replace "addressess" with -- addresses --

Column 8,
Line 9, replace "system memory" with -- memory system --
Line 11, replace "system memory" with -- memory system --

Signed and Sealed this

Fourteenth Day of August, 2001

*Attest:*

NICHOLAS P. GODICI
*Attesting Officer*     *Acting Director of the United States Patent and Trademark Office*